(12) United States Patent
Ryu et al.

(10) Patent No.: US 10,581,025 B2
(45) Date of Patent: Mar. 3, 2020

(54) DEPOSITION APPARATUS FOR ORGANIC LIGHT-EMITTING DIODES

(71) Applicant: LG Display Co., Ltd., Seoul (KR)

(72) Inventors: Jae-Kwang Ryu, Goyang-si (KR); Jong-Heon Kim, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 317 days.

(21) Appl. No.: 15/448,101

(22) Filed: Mar. 2, 2017

(65) Prior Publication Data

US 2017/0256753 A1 Sep. 7, 2017

(30) Foreign Application Priority Data

Mar. 3, 2016 (KR) .................. 10-2016-0025401

(51) Int. Cl.
| | |
|---|---|
| *H01L 51/56* | (2006.01) |
| *H01L 21/683* | (2006.01) |
| *C23C 14/04* | (2006.01) |
| *H01L 21/68* | (2006.01) |
| *H01L 21/687* | (2006.01) |
| *C23C 14/12* | (2006.01) |
| *C23C 14/50* | (2006.01) |
| *H01L 51/00* | (2006.01) |

(52) U.S. Cl.
CPC ............ *H01L 51/56* (2013.01); *C23C 14/042* (2013.01); *C23C 14/12* (2013.01); *C23C 14/50* (2013.01); *H01L 21/682* (2013.01); *H01L 21/6831* (2013.01); *H01L 21/68735* (2013.01); *H01L 21/68742* (2013.01); *H01L 51/001* (2013.01); *H01L 51/0011* (2013.01)

(58) Field of Classification Search
CPC .................................................... C23C 14/24
See application file for complete search history.

(56) References Cited

U.S. PATENT DOCUMENTS 5,439,524 A * 8/1995 Cain ................. C23C 16/45565
118/715

FOREIGN PATENT DOCUMENTS

| CN | 1522098 A | 8/2004 |
|---|---|---|
| CN | 102212778 A | 10/2011 |

(Continued)

OTHER PUBLICATIONS

Nakane JP2007-287943 Jan. 2007 eng mach translation (Year: 2007).*

(Continued)

*Primary Examiner* — Joseph A Miller, Jr.
(74) *Attorney, Agent, or Firm* — Seed Intellectual Property Law Group LLP

(57) ABSTRACT

Disclosed is a deposition apparatus for an organic light-emitting diode, which is capable of preventing a large piece of glass from sagging due to gravity. The deposition apparatus allows the glass to be adhered to the lower surface of a planar electrostatic chuck from the center portion toward the edge portion thereof in the state in which it is upwardly convexly bent, thereby preventing deformation of a mask caused by the amount of sag of the glass. In addition, the deposition apparatus enables rapid alignment of the glass and the mask because the glass and the mask are adhered to each other via measurement of respective alignment marks provided thereon after the glass is located as close as possible to the mask without coming into contact with the mask.

7 Claims, 5 Drawing Sheets

(56) References Cited

FOREIGN PATENT DOCUMENTS

| | | |
|---|---|---|
| EP | 1 426 462 A2 | 6/2004 |
| JP | 1-313954 A | 12/1989 |
| JP | 4-73950 A | 3/1992 |
| JP | 2006-172930 A | 6/2006 |
| JP | 2006-299358 A | 11/2006 |
| JP | 2007-287943 A | 11/2007 |
| JP | 2008-75128 A | 4/2008 |
| JP | 2010-31345 A | 2/2010 |
| JP | 2011-165581 A | 8/2011 |
| JP | 2014-65959 | 4/2014 |

OTHER PUBLICATIONS

JP2006172930 Umetsu Jun. 29, 2006 Eng machine translation (Year: 2006).*
JP2010029353 Fukao Aug. 2011 Eng machine translation (Year: 2011).*

* cited by examiner

DEPOSITION APPARATUS FOR ORGANIC LIGHT-EMITTING DIODES

CROSS-REFERENCE TO RELATED APPLICATION(S)

This application claims the benefit of Republic of Korea Patent Application No. 10-2016-0025401, filed on Mar. 3, 2016, which is hereby incorporated by reference as if fully set forth herein.

BACKGROUND

Technical Field

The present disclosure relates to a deposition apparatus for organic light-emitting diodes, and more particularly, to a deposition apparatus for organic light-emitting diodes in which a target is disposed in the lower region and a piece of glass is disposed above the target so that a deposition material may be deposited on the lower surface of the glass in an upward deposition manner.

Discussion of the Related Art

With the advent of the information age, the field of displays that visually display electrically conveyed information signals is rapidly developing. Thus, research into the development of various flat panel display devices that are thinner and lighter and consume less power continues.

Representative example of such flat panel display devices may include a liquid crystal display (LCD) device, a plasma display panel (PDP) device, a field emission display (FED) device, an electro luminescence display (ELD) device, an electro-wetting display (EWD) device, and an organic light-emitting display (OLED) device.

These flat panel display devices commonly require a flat display panel to realize an image. Such a flat display panel is configured in such a manner that a pair of substrates is bonded to face each other with a particular light-emitting material or polarizer material interposed therebetween.

Among these, the organic light-emitting display (OLED) device is a device that displays an image using organic light-emitting diodes, which are self-luminous elements.

Such an organic light-emitting display device ideally generates a limited amount of heat compared to other flat panel display devices. In addition, the demand for organic light-emitting display devices in industry is increasing due to the self-luminous advantage thereof. In a method of manufacturing an organic light-emitting display device, a crucible, in which an organic material is stored, is heated so that the vaporized organic material is deposited in the form of a thin film on a piece of glass.

At this time, a mask having a predetermined pattern formed thereon, through which the organic material may selectively pass, is located between the glass and the crucible. The organic material is deposited on the glass in conformity with the pattern of the mask. The method of manufacturing the organic light-emitting display using the mask is disclosed in Korean Patent Registration No. 351822.

However, as the piece of glass becomes larger, when the glass sags down due to gravity and thus comes into contact with the mask, deformation of the mask may occur. Therefore, it may be desirable for the glass to come into contact with the mask without causing deformation of the mask.

Moreover, because the amount that the glass sags and the amount that the mask sags are different, great amounts of time and expense need to be consumed to precisely align them, and the different amounts of sag deteriorate uniformity of contact, which may increase the defect rate due to spots.

BRIEF SUMMARY

Accordingly, the present disclosure is directed to a deposition apparatus for organic light-emitting diodes that substantially obviates one or more problems due to limitations and disadvantages of the related art.

An object of the present disclosure is to provide a deposition apparatus for organic light-emitting diodes, in which a piece of glass comes into close contact with a planar electrostatic chuck so as to be adhered thereto prior to coming into contact with a mask, and thereafter is again adhered to and aligned with the mask in the state in which no sagging occurs.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with embodiments of the disclosure, as embodied and broadly described herein, there is provided a deposition apparatus for organic light-emitting diodes including a support unit configured to support a piece of glass from a bottom side thereof, and an attraction unit configured to attract the glass from a top side thereof. At this time, a pressure unit is provided to apply pressure to the edge portion of the glass so that the center portion of the glass protrudes upward before the glass is vacuum-attracted by the attraction unit. As such, when the attraction unit attempts to attract the glass, the attraction of the glass is gradually performed starting from the center portion toward the edge portion of the glass, which may prevent the glass from sagging.

It is to be understood that both the foregoing general description and the following detailed description of the present disclosure are exemplary and explanatory and are intended to provide further explanation of the invention as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principles of the disclosure. In the drawings.

DETAILED DESCRIPTION

Figure 1:
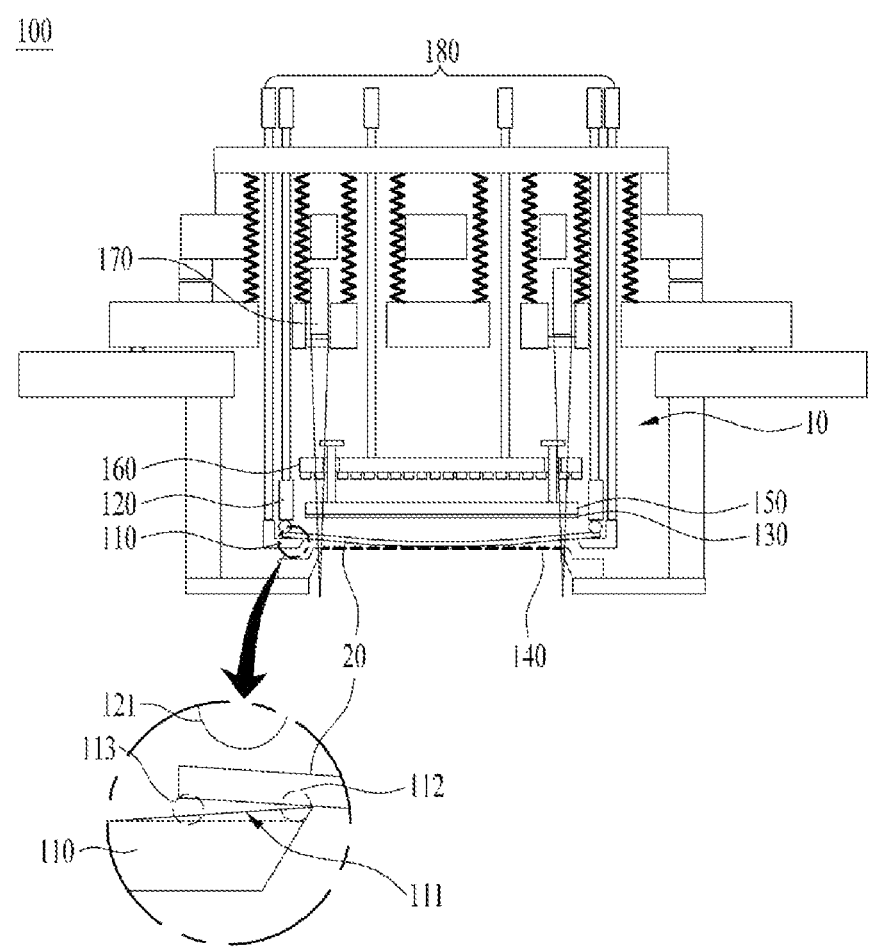
FIG. 1 is a cross-sectional view illustrating a deposition apparatus for organic light-emitting diodes according to an embodiment of the present disclosure.

Hereinafter, exemplary embodiments of the present disclosure will be described with reference to the accompanying drawings to assist easy implementation by those skilled in the art. It should be noted that the same or substantially similar elements are designated by the same reference numerals throughout the accompanying drawings. In addition, in the following description of the present disclosure, a detailed description of known functions and configurations incorporated herein will be omitted when it may make the subject matter of the present disclosure rather unclear. In addition, certain features illustrated in the drawings are enlarged, contracted, or simplified for easy description, and the drawings and the constituent elements thereof are not necessarily illustrated in accurate proportions. However, those skilled in the art may easily understand these details.

Figure 2:
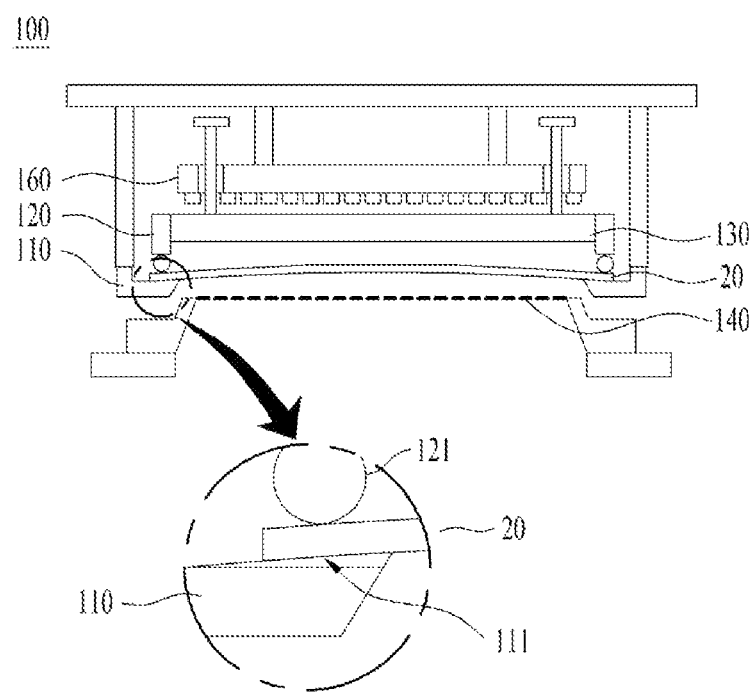
FIG. 2 is a cross-sectional view illustrating the state in which a pressure unit applies pressure to a glass in the deposition apparatus for organic light-emitting diodes illustrated in FIG. 1.
Figure 3:
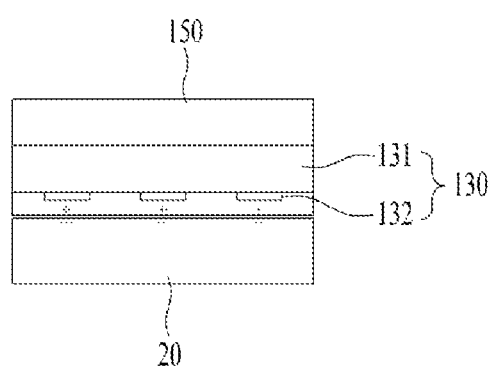
FIG. 3 is a cross-sectional view schematically illustrating an electrostatic chuck of the deposition apparatus for organic light-emitting diodes illustrated in FIG. 2.
Figure 4:
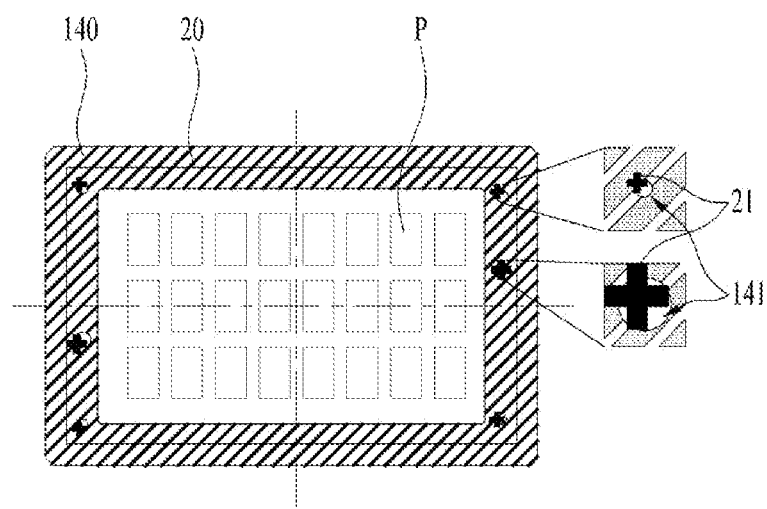
FIG. 4 is a reference view schematically illustrating the state of alignment of the glass and a mask, which is viewed through an alignment camera of the deposition apparatus for organic light-emitting diodes illustrated in FIG. 1.

FIG. 1 is a cross-sectional view illustrating a deposition apparatus 100 for organic light-emitting diodes according to an embodiment of the present disclosure, FIG. 2 is a cross-sectional view illustrating the state in which a pressure unit applies pressure to a glass in the deposition apparatus 100 for organic light-emitting diodes illustrated in FIG. 1, FIG. 3 is a cross-sectional view schematically illustrating an electrostatic chuck of the deposition apparatus 100 for organic light-emitting diodes illustrated in FIG. 2, and FIG. 4 is a reference view schematically illustrating the state of alignment of the glass and a mask, which is viewed through an alignment camera of the deposition apparatus 100 for organic light-emitting diodes illustrated in FIG. 1.

The deposition apparatus 100 for organic light-emitting diodes according to an embodiment of the present disclosure includes a support unit 110, which is vertically movably placed within a vacuum chamber 10 (i.e., the support unit 100 is positioned in, and vertically movable within, the vacuum chamber 10) and is configured to support a glass 20 thereon, a pressure unit 120, which is configured to vertically move and to apply pressure to the edge portion of the upper surface of the glass 20 so that the center portion of the glass 20 protrudes upward, an electrostatic chuck 130, which is configured to be adhered to the upper surface of the glass 20 in order to prevent the glass 20 from sagging, and a mask 140, which is disposed below the glass 20 and is provided with a set deposition pattern P.

In addition, a cooling plate 150 is provided above the electrostatic chuck 130 and serves to prevent the overheating of the glass 20 and/or the mask 140.

In addition, a magnet plate 160 is provided above the cooling plate 150 and serves to keep the mask 140 and the glass 20 in a state of contact using magnetic force after the glass 20 is adhered to the electrostatic chuck 130.

In addition, an alignment camera 170 is provided above the magnet plate 160 and serves to measure the state of alignment of a first mark 21 provided on the glass 20 and a second mark 141 provided on the mask 140.

In the following description, the glass includes a substrate that is used in a flat panel display element, such as an organic light-emitting diode.

In addition, the following description relates to upward deposition by way of example, in which the glass 20 is supplied into the vacuum chamber 10 via a robotic loader L (see FIG. 5) and is seated on the support unit 110, the state of alignment of the glass 20 and the mask 140 is adjusted, and a deposition material is emitted from the bottom side of the glass 20 in the completely aligned state so as to perform a deposition process. Of course, the present disclosure is not limited thereto, and in one or more embodiments, the deposition material may be deposited in the state in which the glass is oriented in the vertical direction or in an oblique direction.

The support unit 110 is provided in a wedge form. Thus, the support unit 110 has a substantially rectangular shape having an open center portion, and supports the edge portion, i.e., the non-display area, of the glass 20 from the bottom side thereof via the edge thereof. When the glass 20 is put on the support unit 110, the center portion of the glass 20 sags downward due to gravity. Of course, the larger the piece of glass, the greater the amount of sag thereof.

At this time, the upper surface of the support unit 110 is provided on opposite ends thereof with sloped portions 111, which come into contact with the edge portion of the glass 20.

Each of the sloped portions 111 is shaped such that the height thereof is gradually increased from the edge portion to the center portion of the glass 20, or is gradually increased inward from the outer side of the edge portion of the support unit 110. Accordingly, when the glass 20 is loaded onto the support unit 110, the edge portion of the glass 20 comes into contact with and is supported by the highest end of the sloped portion 111.

At this time, opposite ends of the edge portion of the glass 20 are spaced apart from the support unit 110, rather than coming into contact with the upper surface of the support unit 110, due to the height difference of the sloped portions 111. Therefore, a contact area 112, in which the edge portion of the loaded glass 20 excluding the opposite ends comes into contact with the top of the sloped portion 111, and a non-contact area 113, in which the upper surface of the support unit 110, which is located lower than the sloped portion 111, does not come into contact with the glass 20, which is at the same height as the sloped portion 111, are formed. The contact area 112 and the non-contact area 113, which are formed due to the height difference along the upper surface of the support unit 110, may be formed by the upper surface of the support unit 110 having various alternative shapes or geometries, including for example, a stepped structure having different height portions or a curvilinear inclined structure, in addition to the above-described planar sloped portions.

When the sloped portion 111 described above is formed, it may be possible to allow the glass 20, which is in the downwardly sagged state due to gravity, to be changed into an upwardly convexly bent state by the pressure unit 120, which will be described below.

The pressure unit 120 is disposed to vertically move. The pressure unit 120 applies pressure to opposite sides of the edge portion of the glass 20, which is in the downwardly bent state due to gravity on the support unit 110, so that the glass 20 is changed from the downwardly bent state into an upwardly convexly bent state.

Thereby, as illustrated in FIG. 2, the glass 20 is bent so as to upwardly protrude, and the center portion of the glass 20 becomes closer to the center of the lower surface of the electrostatic chuck 130.

At this time, the pressure unit 120 applies pressure to the edge portion of the glass 20 in the direction perpendicular to the sloped portion 111 so that the center portion of the glass 20 is upwardly convexly bent. To this end, the pressure unit 120 includes a roller 121, which may prevent damage to the glass 20 due to the friction between the glass 20 and the pressure unit 120 when the pressure unit 120 applies pressure to the glass 20 in the direction perpendicular to the sloped portion 111.

The roller 121 is disposed on the end of the pressure unit 120 so as to come into contact with the glass 20. The roller 121 may be deformed in shape when applying pressure to the glass 20, and may undergo positional movement relative to the glass 20. At this time, because the roller 121 may rotate on the glass 20, frictional damage may be prevented even if positional movement occurs at the interface between the glass 20 and the roller 121. Although FIGS. 1 and 2 show the pressure unit 120, the deposition apparatus 100 for organic light-emitting diodes according to an embodiment of the present invention may not include the pressure unit 120.

The electrostatic chuck 130, as illustrated in FIG. 3, includes an insulating layer 131 formed on the lower surface of the cooling plate 150, and an electrode pattern 132 formed in the insulating layer 131.

The insulating layer 131 may be formed of alumina ($Al_2O_3$), which is a metal powder having high resistance. The electrode pattern 132 may attract the glass 20 by generating electrostatic force upon receiving a DC voltage.

In the state in which the center portion of the glass 20 is upwardly convexly bent, when the electrostatic chuck 130 is moved downward or the support unit 110 is moved upward and a voltage is applied to the electrostatic chuck 130, the center portion of the glass 20 first comes into contact with the lower surface of the electrostatic chuck 130 to thereby be adhered to the electrostatic chuck 130. Then, as the pressure unit 120 is gradually moved upward so that the pressure applied to the edge portion of the glass 20 is gradually released, the glass 20 is gradually adhered to the electrostatic chuck 130 from the center portion toward the edge portions thereof. Accordingly, complete adherence between the glass 20 and the electrostatic chuck 130 may be accomplished without a separate structure for pushing the glass 20 upward.

After the glass 20 is completely adhered to the electrostatic chuck 130, the electrostatic chuck 130 is moved downward so as to be located close to the mask 140 so that the glass 20 is located as close as possible to the mask 140 without coming into contact with the mask 140.

At this time, the alignment camera 170 measures the first mark 21 provided on the glass 20 and the second mark 141 provided on the mask 140 so as to align the glass 20 and the mask 140 with each other. Here, each of the support unit 110, the pressure unit 120, the electrostatic chuck 130, the cooling plate 150, and the magnet plate 160 is provided with or driven by a drive unit 180 so as to be transported in the vertical direction or in the horizontal direction for the alignment of the positions of the first mark 21 and the second mark 141. The drive unit 180 may align the first mark 21 and the second mark 141 with each other by rectilinearly reciprocating the aforementioned respective elements in the front-and-rear direction, in the left-and-right direction, or in the vertical direction, or rotating the same.

When the alignment of the mask 140 and the glass 20 is completed, the mask 140 is adhered to the glass 20, and preparation for a deposition process is completed.

In addition, the magnet plate 160 functions to generate magnetic force in the state in which the glass 20 and the mask 140 are in close contact with each other so as to magnetically attract the mask 140, which is formed of a metal material, thereby causing the close contact between the glass 20 and the mask 140. Accordingly, even if the curvature of the glass 20 and the curvature of the mask 140 are different due to gravity in the case where a large piece of glass 20 is applied, the occurrence of shadowing caused by deterioration in the ability to realize contact between the glass 20 and the mask 140 may be prevented.

In addition, the cooling plate 150 functions to cool the glass 20 or the mask 140 during a deposition process, thereby preventing the overheating thereof. Thus, the deformation of the glass 20 may be prevented, and the precise formation of a thin-film pattern may be achieved. Although not illustrated in the drawings, the cooling plate 150 may include, for example, a cooling line (not illustrated), into which cooling water or cooled air is introduced.

Hereinafter, a control method of the deposition apparatus for organic light-emitting diodes according to the present disclosure will be described with reference to the accompanying drawings.

FIGS. 5 through 10 are reference views illustrating the process of causing the glass to come into close contact with or to be adhered to the mask in the deposition apparatus for organic light-emitting diodes illustrated in FIG. 1.

Figure 5:
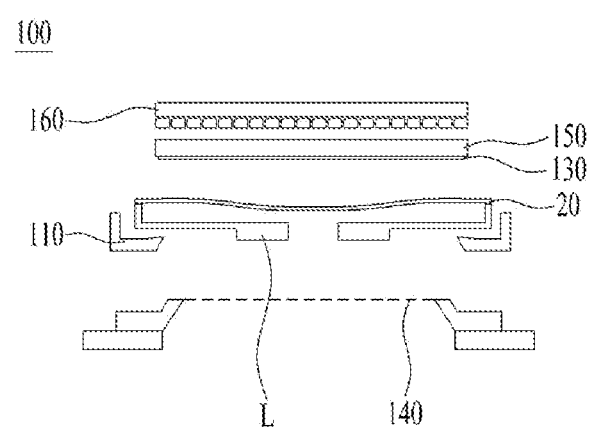
FIGS. 5 through 10 are reference views illustrating the process of causing the glass to come into close contact with or to be adhered to the mask in the deposition apparatus for organic light-emitting diodes illustrated in FIG. 1.
Figure 6:
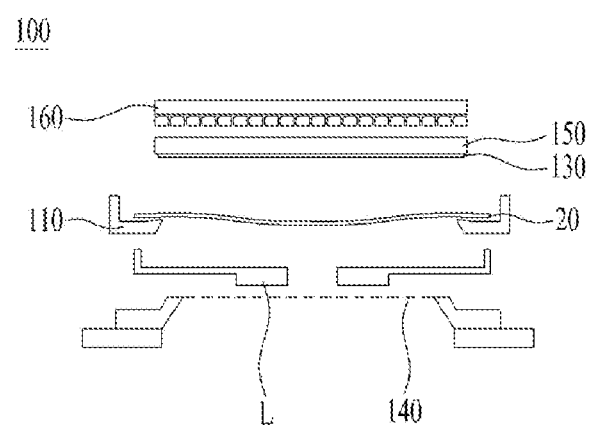

First, referring to FIG. 5, a loader L, on which the glass 20 is placed, is loaded into the support unit 110. Then, as illustrated in FIG. 6, the loader L is transported outward from the support unit 110 after the glass 20 is placed on the support unit 110.

At this time, it can be seen that only the edge portion of the glass 20 is supported on the support unit 110 and the center portion of the glass 20 sags downward due to gravity.

Figure 7:
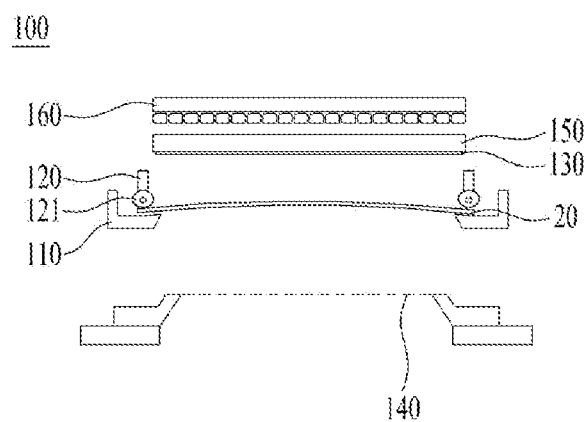

In the state in which the center portion of the glass 20 sags downward, the amount of sag of the glass 20 may be too large to allow the glass 20 to be adhered to the electrostatic chuck 130 even if the electrostatic chuck 130 attempts to attract the glass 20. Therefore, as illustrated in FIG. 7, the pressure unit 120 is moved downward so that the roller 121 pushes the edge portion of the upper surface of the glass 20, thereby causing the center portion of the glass 20 to be upwardly convexly bent.

Here, the extent by which the edge portion of the glass 20 is pushed and bent may vary depending on the angle of the sloped portion 111 on the upper surface of the support unit 110, and the angle of the sloped portion 111 may be adjusted in consideration of the size or weight of the glass 20. Of course, when the distance between opposite ends of the support unit 110 is reduced, the extent by which the glass 20 is bent may be controlled regardless of the angle of the sloped portion 111.

Figure 8:
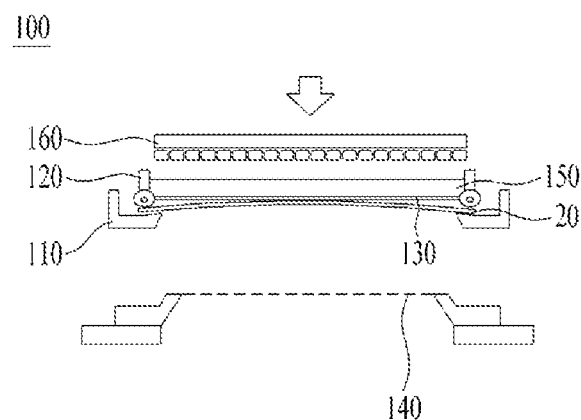

When the center portion of the glass 20 protrudes to a set height, or corresponds to a set curvature range, as illustrated in FIG. 8, the electrostatic chuck 130 is moved downward so that the glass 20 is electromagnetically adhered to the electrostatic chuck 130 starting from the center portion thereof.

Figure 9:
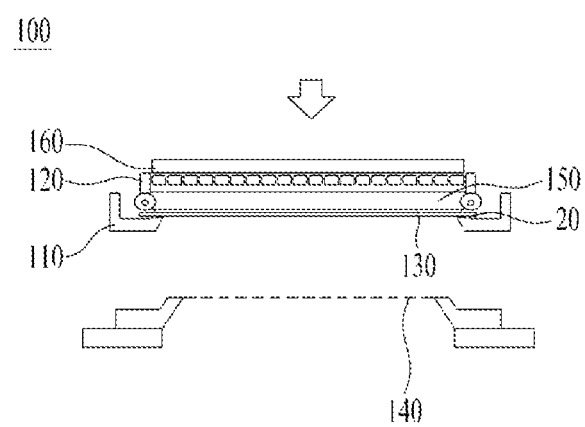

In order to ensure that the glass 20 is gradually adhered to the electrostatic chuck 130 so as to be uniformly adhered from the center portion to the edge portions thereof, as illustrated in FIG. 9, the pressure applied to the glass 20 by the pressure unit 120 is gradually released, and the support unit 110 is moved upward by a predetermined height until the glass 20 is completely adhered to the electrostatic chuck 130. At this time, when the pressure unit 120 no longer applies pressure, the support unit 110 is no longer moved upward, and the electrostatic chuck 130 is moved downward to attract the glass 20. In addition, the upward movement of the support unit 110 and the downward movement of the electrostatic chuck 130 may be performed at the same time.

Figure 10:
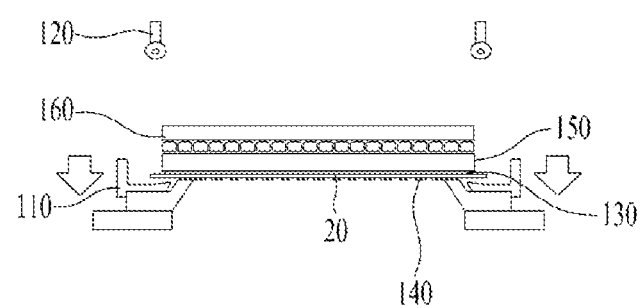

Then, as illustrated in FIG. 10, in the state in which the glass 20 and the electrostatic chuck 130 remain adhered to each other, the support unit 110 and the electrostatic chuck 130 are moved downward so that the glass 20 is adhered to the mask 140.

Then, when a voltage is applied to the magnet plate 160 to create attraction between the magnet plate 160 and the mask 140, the electrostatic chuck 130, the glass 20, and the mask 140 are completely adhered to one another.

Thereafter, a deposition process may be performed when a deposition material is emitted from the bottom side of the mask 140.

Accordingly, with the deposition apparatus 100 for organic light-emitting diodes of the present disclosure, the amount of sag of the glass 20 due to gravity within the vacuum chamber 10 may be compensated for to allow the glass 20 to be easily adhered to the electrostatic chuck 130, and consequently, deformation of the mask 140, which is caused when the sagged glass 20 comes into contact with the mask 140, may be prevented.

As is apparent from the above description, a deposition apparatus for organic light-emitting diodes according to the present disclosure has the following effects.

First, by applying pressure to the edge portion of a large piece of glass using a pressure unit, it may be possible to allow the center portion of the glass to be upwardly convexly bent.

Second, by attracting the glass from the center portion thereof using an electrostatic chuck, it may be possible to allow the glass to completely come into close contact with the electrostatic chuck from the center portion to the edge portion thereof.

Third, because the glass may be kept in a planar state, deformation of a mask may be prevented when the glass comes into contact with the mask.

Fourth, through the measurement of alignment marks provided on the glass and the mask, the glass and the mask may be adhered to each other in a state of close contact, which may ensure easy and rapid implementation of alignment thereof.

It will be apparent to those skilled in the art that the present disclosure described above is not limited to the embodiments described above and the accompanying drawings, and various substitutions, modifications, and alterations may be devised within the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A deposition apparatus for an organic light-emitting diode, comprising:
    a support unit configured to support opposite edge portions of a lower surface of a glass loaded thereon, the support unit being vertically movable and rotatable within a vacuum chamber;
    a pressure unit configured to apply pressure to opposite edge portions of an upper surface of the glass on the support unit so that a center portion of the glass is upwardly convexly bent;
    an electrostatic chuck configured to vertically move above the glass and to attract the glass; and
    a mask having a set deposition pattern, the mask being positioned underneath the glass,
    wherein the support unit includes sloped portions provided on opposite ends thereof so that a height of an upper surface of the support unit is gradually increased inwardly from an outer side of an edge portion of the support unit,
    wherein the edge portions of the glass are loaded onto the sloped portions of the support unit.

2. The deposition apparatus according to claim 1, wherein the pressure unit includes rollers provided above the sloped portions of the support unit, the rollers being operable to come into contact with the opposite edge portions of the upper surface of the glass.

3. The deposition apparatus according to claim 1, further comprising a cooling plate provided above the electrostatic chuck to prevent overheating of at least one of the glass and the mask.

4. The deposition apparatus according to claim 1, further comprising a magnet plate provided above the electrostatic chuck to keep the mask and the glass in contact with each other using magnetic force after the glass is adhered to the electrostatic chuck.

5. The deposition apparatus according to claim 1, further comprising an alignment camera provided above the electrostatic chuck to measure a state of alignment of a first mark provided on the glass and a second mark provided on the mask.

6. The deposition apparatus according to claim 1, wherein the edge portion of the glass comes into contact with a highest end of the sloped portion.

7. The deposition apparatus according to claim 1, further comprising:
    a driving unit configured to drive the support unit to be vertically moved and rotatable.

* * * * *